United States Patent [19]
Chan et al.

[11] Patent Number: 5,103,313
[45] Date of Patent: Apr. 7, 1992

[54] BAND INDICATIVE SEGMENTED TUNING BAR DISPLAY

[75] Inventors: Choon M. Chan, Singapore, Singapore; Jean C. Favreau, Tannheim, Fed. Rep. of Germany; Doo L. Tay, Singapore, Singapore

[73] Assignee: Thomson Consumer Electronics, S.A., Courbevoie, France

[21] Appl. No.: 576,920

[22] Filed: Sep. 4, 1990

[30] Foreign Application Priority Data

Dec. 18, 1989 [GB] United Kingdom ............... 8928551

[51] Int. Cl.⁵ ............................................. H04N 5/50
[52] U.S. Cl. .............................. 358/192.1; 358/193.1; 455/154.1
[58] Field of Search ............... 358/192.1, 191.1, 193.1; 455/154, 158, 176, 180, 188

[56] References Cited

U.S. PATENT DOCUMENTS

| | | | |
|---|---|---|---|
| 4,040,719 | 8/1977 | Schiebelhuth | 350/160 |
| 4,131,853 | 12/1978 | Dreiske | 325/464 |
| 4,214,273 | 7/1980 | Brown | 358/192.1 |
| 4,366,502 | 12/1982 | Shiu | 358/193.1 |
| 4,410,913 | 10/1983 | Chin | 358/192.1 |
| 4,598,317 | 7/1986 | Yu | 358/192.1 |
| 4,605,968 | 8/1986 | Hayashi | 358/188 |
| 4,649,429 | 3/1987 | Park | 358/192.1 |
| 4,935,814 | 6/1990 | Omoto | 358/192.1 |

FOREIGN PATENT DOCUMENTS

| | | |
|---|---|---|
| 0186205 | 7/1986 | European Pat. Off. . |
| 2432600 | 1/1976 | Fed. Rep. of Germany . |
| 55320 | 5/1977 | Japan ............... 358/192.1 |

OTHER PUBLICATIONS

Sony Trinitron Colour TV-25XSD, KV-25XSTD Operating Instructions, 1987 pp. 1-6.

Primary Examiner—Tommy P. Chin
Attorney, Agent, or Firm—Joseph S. Tripoli; Peter M. Emanuel; Thomas F. Lenihan

[57] ABSTRACT

A tuning system for a television receiver produces a tuning bar for display on a display screen. The horizontal position of the tuning bar is controlled in response to the tuning voltage. The tuning bar is segmented into a large portion and one or more smaller portions. The number of smaller portions of the tuning bar is representative of the band being tuned.

4 Claims, 7 Drawing Sheets

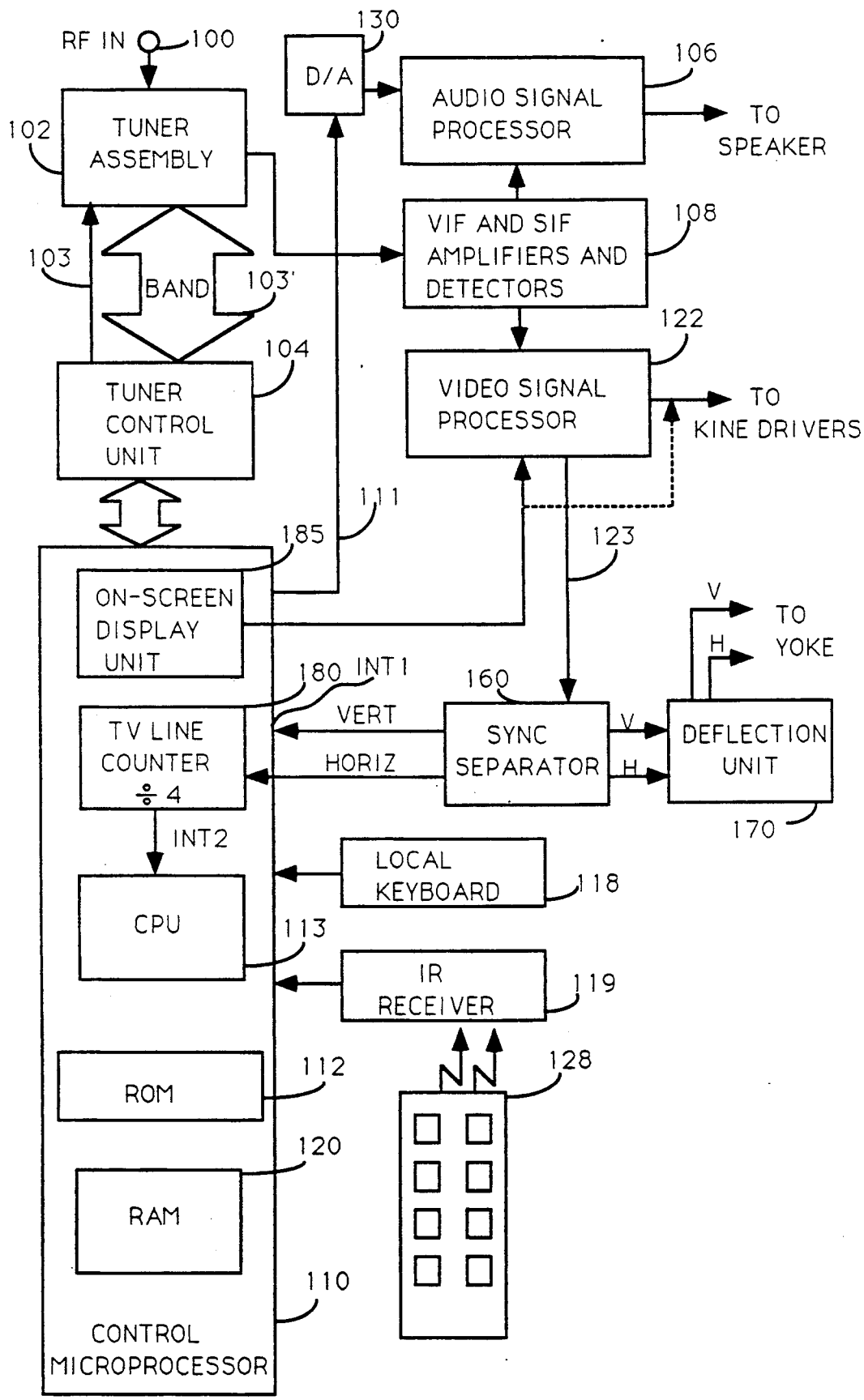

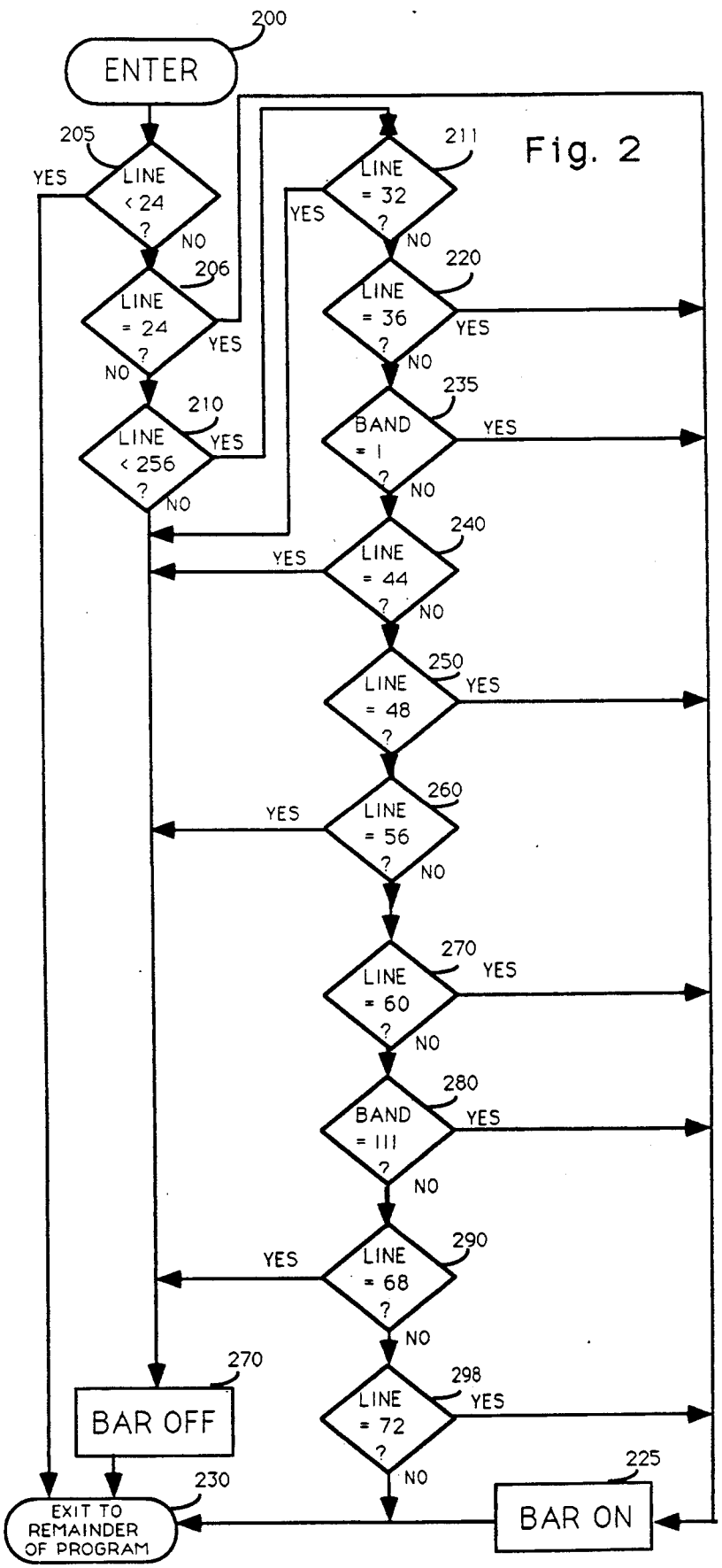

BAND INDICATIVE SEGMENTED TUNING BAR DISPLAY

CLAIM OF PRIORITY

The subject patent application claims priority, under 35 U.S.C. 119, British Section 15 (1) application serial number 8928551.4, which was filed on 18 Dec. 1989.

CROSS REFERENCE TO A RELATED APPLICATION

A patent application bearing U.S. application Ser. No. 577,168, filed Sept. 4, 1990, and assigned to the same assignee as the subject application, contains related subject matter.

FIELD OF THE INVENTION

The subject invention relates to the field of tuning systems for television receivers.

BACKGROUND OF THE INVENTION

The term televison receiver as used herein includes television receivers having a display device (commonly known as television sets) and television receivers without a display device, such as videocassette recorders (VCR's). Many modern television receivers include circuitry for generating an on-screen indication useful for tuning the televison receiver to selected channels.

In medium-priced and higher-priced television receivers, it is common to include an alphanumeric on-screen display (OSD) generator circuit for providing an on-screen display of channel number. However, in lower-priced television receivers, the use of a separate OSD circuit is generally precluded due to cost considerations.

It is known in lower-cost televison receivers to use a vertical tuning bar to display tuning information. In such a system the relative horizontal portion of the vertical tuning bar is indicative of channel number. The horizontal displacement of the tuning bar is generally a function of magnitude of the tuning voltage required to tune each channel. Band information (VHF-low VHF-high, UHF in the United States, or Bands I, II, III and UHF in Europe) is usually indicated by the color of the tuning bar. Such a system as described thusfar is known from U.S. Pat. No. 4,410,913 (Chin et al.) issued 18 Oct. 1983.

The lowest-priced televisoin receivers of all tend to be monochrome protable televison receivers. Such receivers would benefit from the use of the low-cost tuning bar display of Chin et al. but clearly cannot use the color of the tuning bar to provide tuning band information.

SUMMARY OF THE INVENTION

It is herein recognized that the vertical tuning bar can be generated as a segmented vertical bar comprising a relatively large portion and one or more smaller portions, wherein the number of smaller portions is indicative of the tuning band in which tuning is to take place.

BRIEF DESCRIPTION OF THE DRAWING

FIG. 1 illustrates in block diagram form portions of a television receiver suitable for use with the invention.

FIG. 2, and 2a are flow charts showing portions of a control program suitable for use with the microprocessor of FIG. 1.

DETAILED DESCRIPTION OF THE DRAWING

Figure 2A:
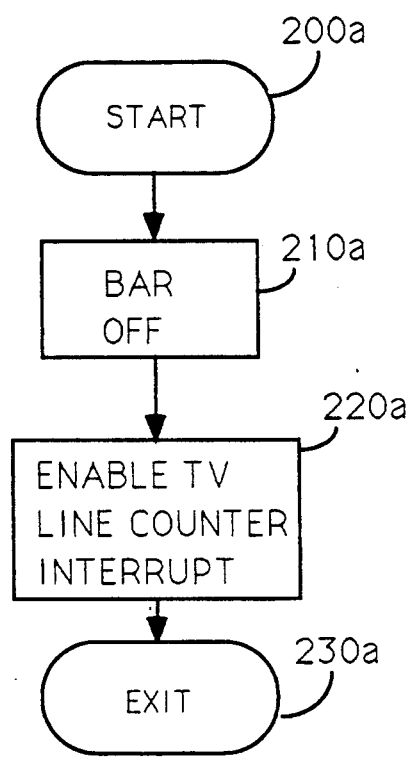

Referring to FIG. 1, a televison receiver includes an RF input terminal 100 which receives radio frequency (RF) signals and applies them to a tuner assembly 102. Tuner assembly 102 selects and amplifies a particular RF signal under control of a tuner controller 104 which provides a tuning voltage via a wire 103, and bandswitching signals via signal lines represented by the broad double-ended arrow 103', to tuner assembly 102.

Tuner assembly 102 converts the received RF signal to an intermediate frequency (IF) signal and provides an IF output signal to video (VIF) and sound (SIF) amplifier and detector unit 108. VIF/SIF amplifier and detector unit 108 amplifies the IF signal applied to its input terminal and detects the video and audio information contained therein. The detected video information is applied as one input of a video processor unit 122. The detected audio signal is applied to an audio processor 106 for processing and amplification before being applied to a speaker (not shown).

Tuner controller 104 (which may be within control microcomputer 110) generates the tuning voltage and bandswitching signals in response to control signals applied from a system control microcomputer ($\mu$C) 110. The terms "microcomputer", controller, and "microprocessor", as used herein, are equivalent. It is also recognized that the control function of microcomputer 110 may be performed by an integrated circuit especially manufactured for that specific purpose (i.e., a "custom chip"), and the term "controller", as used herein, is also intended to include such a device. Microcomputer 110 receives user-initiated commands from an infrared (IR) receiver 119 and from a "local" keyboard 118 mounted on the television receiver itself. IR receiver 119 receives IR transmissions from remote control transmitter 126. Microcomputer 110 includes program memory (ROM) 112, and stores channel-related data in a random-access memory (RAM) 120. RAM 120 may be either internal to, or external to, microprocessor 110, and may be of either the volatile or non-volatile type. The term "RAM" is also intended to include electrically-erasable programmable read only memory (EEPROM). One skilled in the art will recognize that if volatile memory is utilized, that it may be desirable to use a suitable form of standby power to preserve its contents when the receiver is turned off.

Video signal processor 122 supplies a composite video signal to a sync separator unit 160 which produces vertical (V) and horizontal (H) synchronizing signals at respective outputs. The horizontal and vertical synchronizing signals are applied to a horizontal and vertical deflection unit 170 for generating scanning control signals for application to the yoke windings of a picture tube assembly (not shown).

The separated horizontal and vertical synchronizing signals (sync signals) are also applied to respective inputs of controller 110. Controller 110 (which may be a Toshiba TMP47C237 microprocessor) includes a TV line counter unit 180 which is initialized by the vertical sync signal (INT1) interrupt service routines (as shown in FIG. 2a and clocked by the horizontal sync signal. TV line counter unit 180 provides an interrupt signal (INT2) to the control processing unit (CPU) portion of controller 110 at the end of every fourth horizontal line.

Controller 110 also includes an on-screen display unit 185. On-screen display unit 185 has an output coupled to a second input of video signal processor 122, or the kine driver circuitry (not shown), for generating and displaying a vertical bar on the display screen. When enabled, on-screen display unit 185 causes the display of a uniform area of brightness along successive horizontal scanning lines for a period of approximately 2 microseconds (2 μs.). The effect produced on a display screen is that of a vertical bar having a width of approximately one-thirtieth (1/30) of the width of the display screen (i.e., 2/60 μs, where 60 μs. is the approximate period of the viewable portion of a horizontal line in NTSC).

On-screen display unit 180 includes circuitry for generating a high frequency dot clock. The dot clock is phase-locked to the incoming horizontal sync signal when the tuner is tuned to an active TV channel, or free running at a multiple of the nominal horizontal sync frequency when the tuner is not tuned to an active TV channel. The dot clock defines the positions in which the vertical bar may be displayed. In this case, the maximum number of possible display positions which are viewable on the screen is 256. Thus, a vertical bar may be displayed at a specific point on the display screen by specifying a number in the range from 0-255, and applying that number to the on-screen display unit to specify the horizontal start position of the bar.

Controller 110 is programmed to use the four-line interrupt signal provided by TV LINE COUNTER unit 180 to alternately turn-on and turn-off the display of the vertical bar. Alternately turning-on and turning-off the display of the vertical bar a given number of times produces the display of a segmented vertical bar, as shown in FIGS. 3, 4, and 5.

Figure 6:
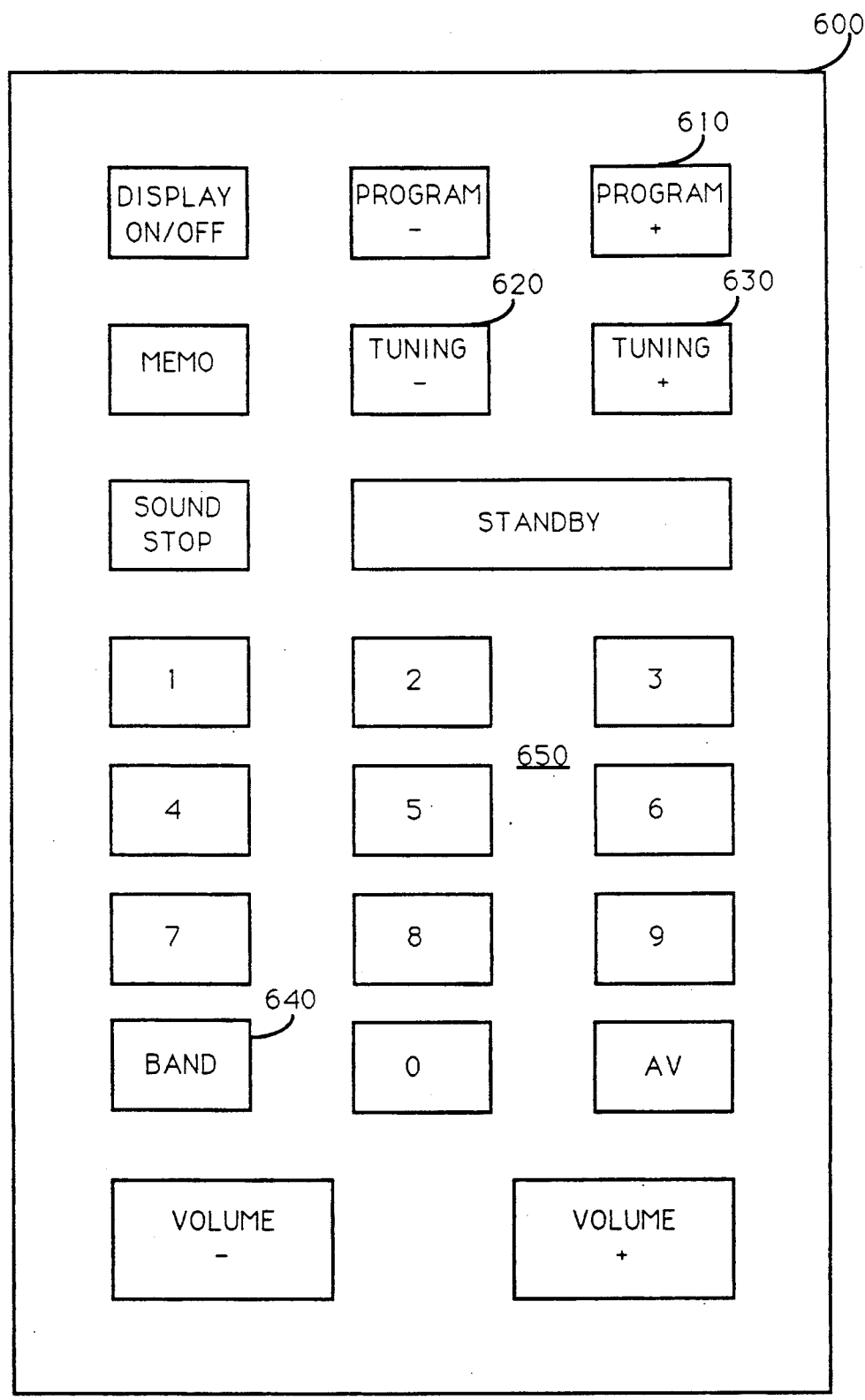
FIG. 6 is a detailed illustration of the remote control unit of FIG. 1.

FIG. 6 shows a detailed view of remote control unit 128 of FIG. 1. Remote control unit 600 of FIG. 6 includes, among other keys, a TUNING− key 620, a TUNING= key 630, and a BAND key 640.

The tuning mode is entered by pressing Band key 640. In response, the OSD causes the display of a tuning bar at a position on the screen which is indicative of the magnitude of the currently generated tuning voltage. A relatively low tuning voltage causes the tuning bar to be displayed on the left side of the display screen. Increasing the tuning voltage causes the tuning bar to be repositioned toward the right side of the display screen. Increasing and decreasing the magnitude of the tuning voltage is accomplished by pressing TUNING= key 630, and TUNING− key 620, respectively.

Figure 3:
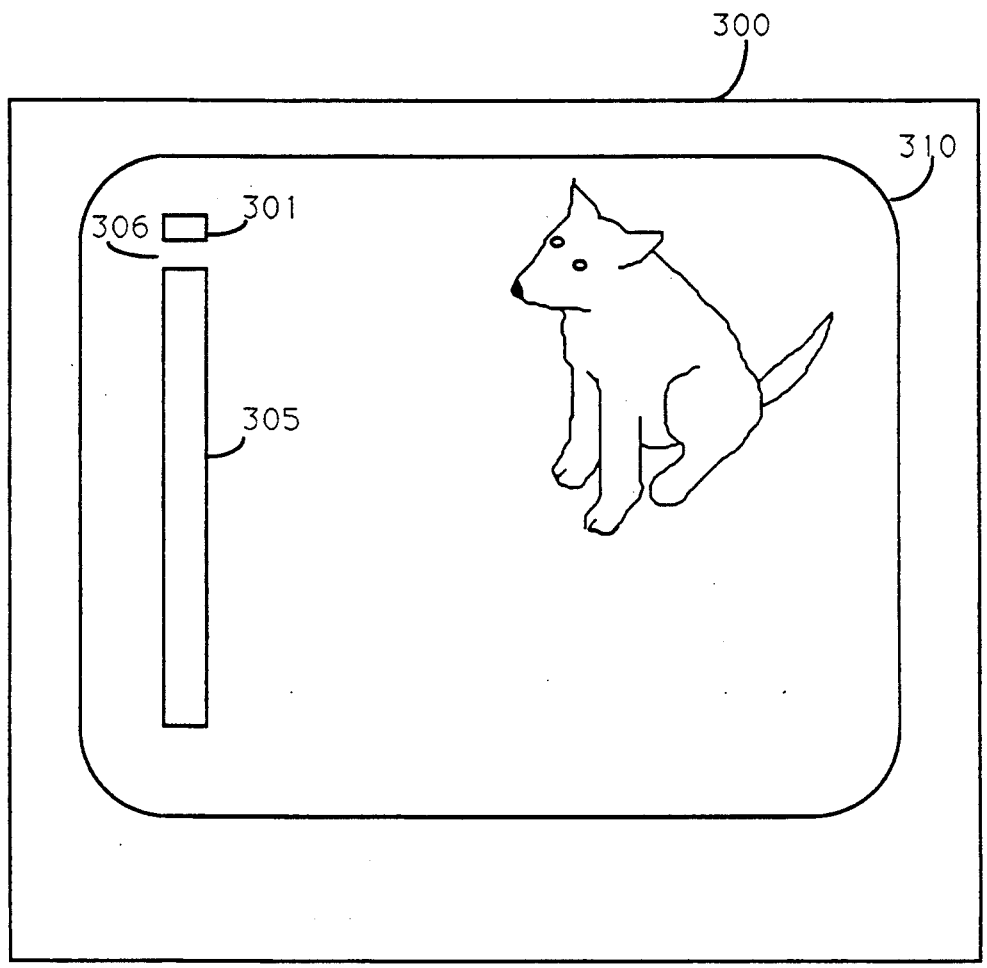
FIGS. 3, 4 and 5 are illustrations of display screens showing displays in accordance with the invention.
Figure 4:
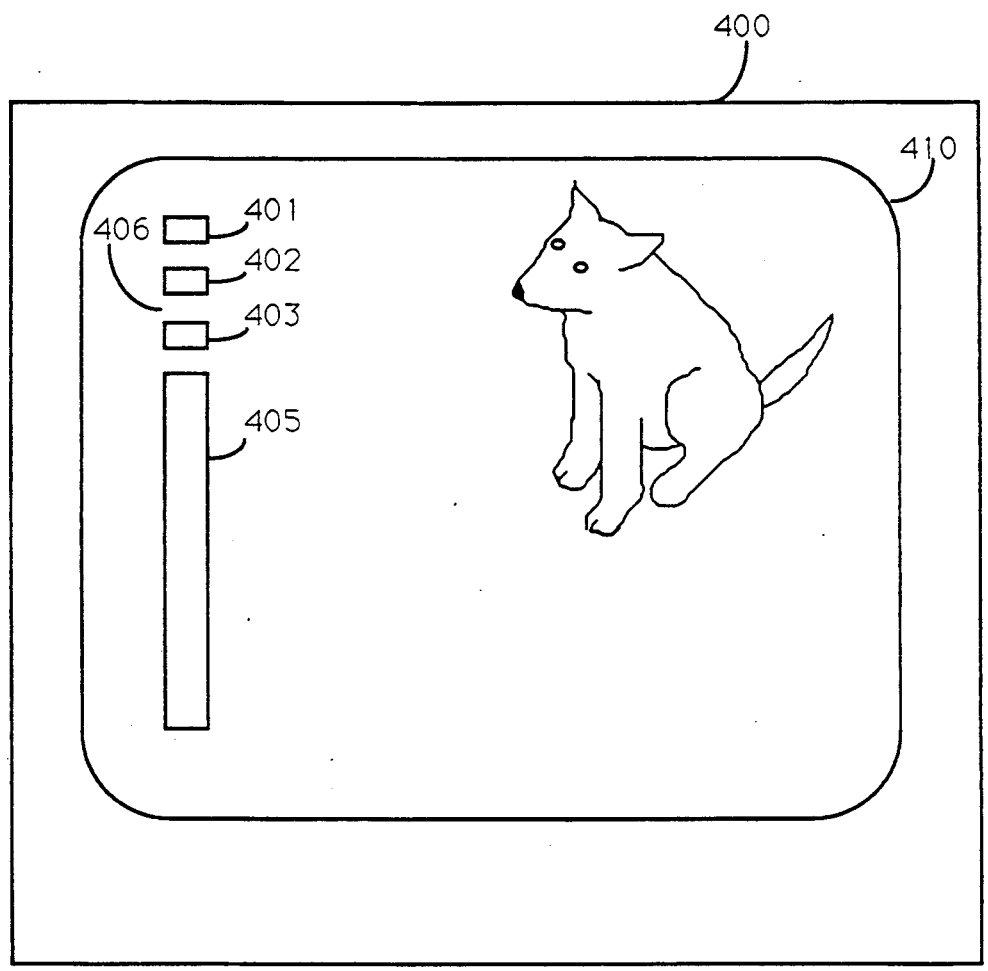
Figure 5:
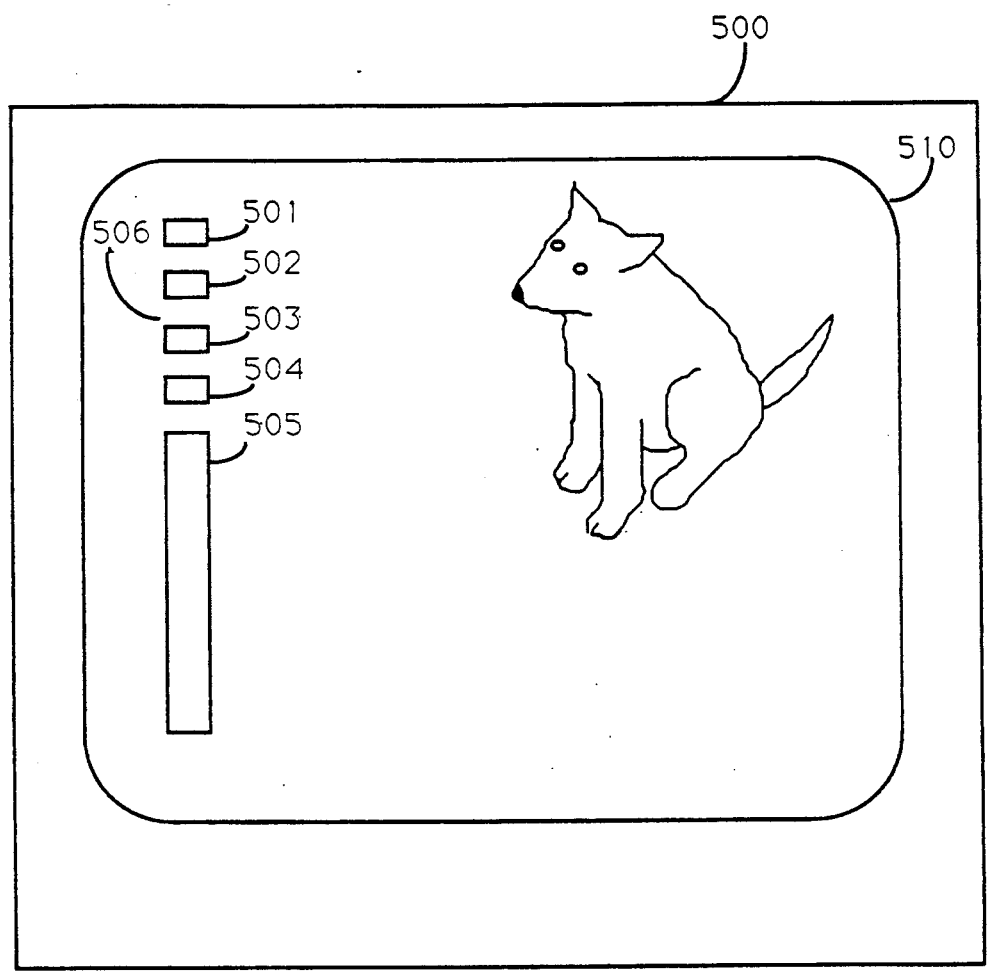

Band information is displayed by segmenting the tuning bar, as shown in FIGS. 3, 4, and 5. FIG. 3 shows a televison receiver 300, having a display screen 310. A tuning bar display for VHF Band I is shown at the left side of the screen. VHF Band I is indicated by segmenting the tuning bar into a single small area (or dot) 301 separated from the main tuning bar 305 by a single space 306. In FIGS. 4, and 5, similarly numbered elements serve the same purpose as those in FIG. 3 and need not be described again. FIG. 4 shows the display for VHF Band III comprising three dots 401–403 separated from each other and from main tuning bar 405 by spaces 406. Similarly, FIG. 5 shows the display for the UHF Band comprising four dots 501–504 separated from each other and from main tuning bar 505 by spaces 506.

Note that the length of the tuning bar stays constant within a given band. Only its position changes in response to changes in tuning voltage, as opposed to known systems in which the length of the tuning bar varies with the tuning voltage. Thus, under snowy, weak, or no signal conditions, the constant-length tuning bar is more clearly visible than a variable length tuning bar which may grow so short as to be lost in the snow on the display screen.

The band-indicative dots described above are really part of the tuning bar. They are formed by blanking a portions of the tuning bar. Thus, the band-indicative dots move left and right along with the main tuning bar in response to a change in the tuning voltage.

The flowchart of FIG. 2 illustrates the portion of the control program executed by microcomputer 110 upon receipt of the above-mentioned four-line interrupt signal generated by TV LINE COUNTER unit 180. The routine is entered at step 200. At step 205, the current TV line number is read to determine if the scan is in the viewing area of the screen. Typically, TV lines 1–17 are in the vertical blanking area at the top of the screen. Therefore, line 20 is the first viewable line at which a four-line interrupt occurs. It is felt that a more pleasing display is generated if the top of the bar begins at line 24. Accordingly, if the current line number is less than 24, then the routine is exited at step 230. If the current line number is greater than 256 (step 210), then the current line is near the bottom of the viewable area of the screen, and the bar may be turned-off (step 270).

If the current line number is 24, then the bar is turned on (step 206). TV line 24 is the start of the first eight-line dot. If the current line number is between 20 and 256, regardless of which band is being tuned, the current line is checked to see if it is line 32 (steps 211). The bar is turned off at line 32. TV line 32 is the start of the space separating the first eight-line dot from the remaining dots or the main tuning bar. If the current line is not 32, then the current line is checked to see if it is 36 (step 220). If so, then the bar is again turned on. If the current line is not 36, then a check is made to see if Band I is currently being turned. If Band I is currently being tuned, then the bar is turned on (step 225), and the program is exited. If Band I is not currently being tuned, then checks are made (step 240 and 260) to see if the current line number is either 44 or 56 (i.e., the starting points of the next spaces separating the band-indicative dots). If so, then the bar is again turned off (step 270). If not, a check is made to see if Band III is currently being tuned (step 280). If Band III is being tuned then no more spaces are necessary in the tuning bar, and the bar is then turned on (step 225). If Band III is not being tuned, it is assumed that the UHF band of frequencies is being tuned. A check is made at step 290 to determine if the current line is line 68. If not, then the bar is again turned on. If so, the bar is turned off, and another check is made at step 298 to turn the bar on again at line number 72.

In the above-described manner, the bar is turned on at all lines other than those which occur in the appropriate number of spaces to indicate each respective band.

As noted above, the subject invention is particularly useful for producing tuning displays for black and white (monochrome) television receivers. However, it is herein recognized that for color television receivers as well, displaying a number of dots to convey band information provides a more meaningful (i.e., more immediately recognizable) tuning display than does a change of color of the tuning bar.

The subject invention is also felt to be particularly useful when incorporated within a videocassette recorder (VCR) because it ensures that programming and tuning information are conveyed to a user even when the output signal of the VCR is coupled to a monochrome televison receiver.

What is claimed is:

1. An on-screen display system for a television receiver, comprising:

tuner means for selecting an RF signal from a plurality of RF signals in at least one band of a plurality of bands of frequencies, and producing an intermediate frequency (IF) signal at an output;

IF amplifier and detector means coupled to said tuner means for receiving and amplifying said IF signal and producing a baseband video signal at an output;

video processing means coupled to said IF amplifier means for receiving and processing said baseband video signal; and control means coupled to said video processing means and said tuner means for generating a video signal which when displayed on a display means produces a vertical bar on said display means, wherein the horizontal position of said vertical bar is indicative of the magnitude of a tuning voltage within one of said bands of frequencies;

said control means generating said vertical bar such that said vertical bar is divided into a first portion occupying a given area and at least one portion occupying smaller areas than said first portion;

wherein the number of said smaller portions of said vertical bar indicates individual respective ones of said bands of frequencies.

2. The televison receiver of claim 1, wherein said control means includes on-screen display means for generating auxiliary video signal representative of said vertical bar.

3. The televison receiver of claim 2, wherein said televison receiver is a videocassette recorder unit having an output terminal at which said video signals for display are produced, and wherein said display means is coupled to said output terminal for receiving said video signals and displaying images in response thereto.

4. An on-screen display system for a television receiver, comprising:

tuner means for selecting an RF signal from a plurality of RF signals in at least one band of a plurality of bands of frequencies in response to a first control signal, and producing an intermediate frequency (IF) signal at an output;

IF amplifier and detector means coupled to said tuner means for receiving and amplifying said IF signal and producing a baseband video signal at an output;

video processing means coupled to said IF amplifier means for receiving and processing said baseband video signal;

display means coupled to said video processing means for displaying a video image corresponding to said video signal;

on-screen display means coupled to said video processing means for generating a second video signal which when displayed on a display means produces a vertical bar on said display means in response to a second control signal;

control means coupled to said video processing means, to said on-screen display means, and to said tuner means for generating said first and second control signals, and for controlling the horizontal position of said vertical bar to indicate the magnitude of a tuning voltage within one of said bands of frequencies;

said control means controlling the generation of said vertical bar by said on-screen display means such that said vertical bar is divided into a first portion occupying a given area and at least one portion occupying a smaller area than said first portion;

wherein the number of said smaller portions of said vertical bar indicates individual respective ones of said bands of frequencies.

* * * * *